United States Patent [19]

Ohnishi et al.

[11] Patent Number: 5,773,334

[45] Date of Patent: Jun. 30, 1998

[54] METHOD OF MANUFACTURING A SEMICONDUCTOR DEVICE

[75] Inventors: Toyokazu Ohnishi; Akinori Seki, both of Toyota, Japan

[73] Assignee: Toyota Jidosha Kabushiki Kaisha, Toyota, Japan

[21] Appl. No.: 531,606

[22] Filed: Sep. 21, 1995

[30] Foreign Application Priority Data

Sep. 26, 1994 [JP] Japan ..................................... 6-229828

[51] Int. Cl.$^6$ ....................... H01L 21/283; H01L 21/331; H01L 21/338
[52] U.S. Cl. .......................... 438/182; 438/184; 438/320; 438/348; 438/579
[58] Field of Search .......................... 437/40 RG, 41 RG, 437/40 SH, 41 SH, 31, 203, 228 S, 912; 438/182, 184, 320, 348, 529, 312

[56] References Cited

U.S. PATENT DOCUMENTS

| | | | |
|---|---|---|---|
| 4,645,563 | 2/1987 | Terada ..................................... | 156/643 |
| 4,937,204 | 6/1990 | Ishibashi et al. ....................... | 438/312 |
| 5,098,853 | 3/1992 | Clark et al. ............................... | 437/31 |
| 5,112,766 | 5/1992 | Fujii et al. ................................ | 437/41 |
| 5,124,270 | 6/1992 | Morizuka .................................. | 437/31 |
| 5,187,112 | 2/1993 | Kohno et al. ............................. | 437/41 |
| 5,288,654 | 2/1994 | Kasai et al. .............................. | 437/41 |
| 5,389,562 | 2/1995 | Mohammad .............................. | 437/31 |
| 5,432,126 | 7/1995 | Oikawa ..................................... | 437/177 |
| 5,538,910 | 7/1996 | Oku ........................................... | 438/579 |

FOREIGN PATENT DOCUMENTS 2-303165  12/1990  Japan .
3-108329   5/1991  Japan .

OTHER PUBLICATIONS

Metal–Semiconductor Field–Effect Transistors, Nobuo Shiga, et al., MWE'92 Microwave Workshop Digest, pp. 413–435.

A. 0.25 μm Inner Sidewall–Assisted Super Self–Aligned Gate Heterojunction Fet Fabricated by All Dry–Etching Technology For Low Voltage Controlled LSIs, Masatoshi Tokushima et al., Technical Report of IEICE, ED92–114, MW92–117, ICD92–135, 1993, pp. 9–16.

*Primary Examiner*—T. N. Quach
*Attorney, Agent, or Firm*—Oblon, Spivak, McClelland, Maier & Neustadt, P.C.

[57] ABSTRACT

A semiconductor device is manufactured by a process comprising the steps of forming a cover film on a surface of a semiconductor substrate such that the cover film exposes a portion of the surface, covers a remaining portion thereof and has an edge along a boundary between the exposed portion and the covered portion, forming a first conductor film in a range from the cover film formed in the cover film forming step through the edge to the exposed surface portion of the semiconductor substrate, removing the first conductor film formed in the first conductor film forming step other than a portion formed along the edge such that the first conductor film is left along the edge, forming an insulating film on the opposite sides of the first conductor film left along the edge in the removing step such that a top edge of the left first conductor film is exposed, and forming a second conductor film on the surface of the insulating film formed in the insulating film forming step along the exposed top edge of the first conductor film. In this method, the gate electrode or the base electrode is formed by a side wall process. It is thus possible to reduce the electrode length/width and improve the response of the element.

15 Claims, 13 Drawing Sheets ures 5,773,334

METHOD OF MANUFACTURING A SEMICONDUCTOR DEVICE

BACKGROUND OF THE INVENTION

1. Field of the Invention

This invention relates to a semiconductor device and a method of manufacturing the same and, more particularly, to a semiconductor device with an improved electrode structure and a method of manufacturing the same.

2. Description of the Prior Art

A prior art example of the method of manufacturing an electrode structure in a semiconductor device is shown in Japanese Laid-Open Patent Publication No. 2-303165. FIGS. 36(a) to 36(d) illustrate the process of manufacture in this prior art example.

First, as shown in FIG. 36(a), a thermal oxide film 72 is formed on a silicon substrate 71, and further, an organic resist film 73 is formed on the thermal oxide film 72 in an active region (a thin portion constituting a gate oxide film) 72a. The resist film 73 thus formed has an edge 73a extending on the active region 72a. Subsequently, as shown in FIG. 36(b), a polycrystalline silicon film 74 is formed to cover the entire upper surface of the wafer shown in FIG. 36(a). Then, as shown in FIG. 36(c), a portion of the polycrystalline silicon film 74 other than a portion covering the edge 73a of the organic resist film 73 is removed by anisotropic dry etching. Subsequently, as shown in FIG. 36(d), the organic resist film 73 is removed by isotropic dry etching.

As a result, a thin conductive film 74 is formed within the active region 72a. This conductive film 74 can be used as a gate electrode. With the MOS FET thus produced, a gate length is constituted by the thickness of the polycrystalline silicon film 74, and thus it can be extremely reduced.

In the above prior art example shown in FIGS. 36(a) to 36(d), the polycrystalline silicon film 74 which extends substantially at right angles to the semiconductor substrate surface is used as the gate electrode, and thus, the gate length is constituted by the thickness of the polycrystalline silicon film 74. It is thus possible to extremely reduce the gate length. On the demerit side, however, because of the thin gate electrode, the resistance thereof in the width direction (i.e., direction W in the drawing) is increased. For example, when the polycrystalline silicon film 74 is connected to an external electrode provided for a gate on the outer side of the active region 72a, an intended potential can not be obtained on a portion of the gate electrode which is remote from the external electrode, and therefore, the MOS transistor operation is instable.

SUMMARY OF THE INVENTION

An object of the invention is to overcome the drawback discussed above by providing an FET type semiconductor device having an electrode structure, which permits sufficient reduction of the gate electrode length and also reduction of the resistance of the gate electrode, and a method of manufacturing the same semiconductor device.

Another object of the invention is to apply the same electrode structure to heterojunctionbipolar semiconductor devices.

According to one aspect of the invention, there is provided a method of manufacturing a semiconductor device, which comprises the steps of:

forming a cover film on a surface of a semiconductor substrate such that the cover film exposes a portion of the surface, covers a remaining portion thereof and has an edge along a boundary between the exposed portion and the covered portion;

forming a first conductor film in a range from the cover film formed in the cover film forming step through the edge to the exposed surface portion of the semiconductor substrate;

removing the first conductor film formed in the first conductor film forming step other than a portion formed along the edge such that the first conductor film is left along the edge;

forming an insulating film on the opposite sides of the first conductor film left along the edge in the removing step such that a top edge of the left first conductor film is exposed; and forming a second conductor film on the surface of the insulating film formed in the insulating film forming step along the exposed top edge of the first conductor film.

In this method, the second conductor film is formed along the top edge of the first conductor film which extends substantially at right angles to the semiconductor substrate surface and has a small thickness. This second conductor film may be formed to have a thickness necessary for holding the resistance to be low. It is thus possible to reduce the gate length and nevertheless reduce the gate resistance. Further, the method permits obtaining a bipolar transistor having an extremely small external base region.

In the above method of manufacture, it is suitable to provide, between the cover film forming step and the first conductor film forming step, a step of etching the surface of the semiconductor substrate with the cover film used as a mask.

Further, in case that the semiconductor substrate has a surface layer in ohmic contact with a conductor and a deeper layer underneath the surface layer and in Schottky contact with a conductor, in the etching step, preferably a recess is formed which penetrates the layer in ohmic contact with the conductor and which reaches the deeper layer in Schottky contact with the conductor.

In this way, it is possible to readily obtain an FET structure which has its source electrode and drain electrode in ohmic contact with the semiconductor substrate and its gate electrode in Schottky contact with the semiconductor substrate. Besides, it is possible to obtain an FET with a small distance between the source electrode and the gate electrode.

Further, it is preferable to execute, after the above process of manufacture, a step of removing the insulating film with the second conductor film formed in the second conductor film forming step used as a mask and a step of forming a third conductor film on the semiconductor substrate surface exposed as a result of removal of the insulating film in the insulating film removing step.

In this case, the third conductor film constitutes a source electrode, and the distance between the source electrode and the gate electrode can be extremely reduced. The source electrode and the gate electrode can be insulated from each other by varying their height.

In the cover film forming step, a cover film having a hole surrounded by a pair of edges may be formed, and in the first conductor film removing step, pair portions of the first conductor film extending along the pair edges of the hole may be left. In this case, a structure having a pair of first conductor films can be obtained. With this structure, an FET having a substantially doubled gate width can be obtained by forming the second conductor film connected to both of the pair first conductor films. Instead, a dual gate structure can be obtained by forming a pair of second conductor films each connected to each of the first conductor films.

According to another aspect of the invention, there is provided a method of manufacturing a semiconductor device, which comprises the steps of:

forming, on a surface of a semiconductor substrate with an emitter layer, a base layer and a collector layer laminated from a surface side, a cover film such as to expose a portion of the surface, cover an island-like remaining portion thereof and has an edge along a boundary between the exposed portion and the island-like covered portion of the surface;

removing a part of the emitter layer with the cover film used as a mask;

forming a first conductor film on the surface and the edge of the cover film, the side surface of the remaining emitter layer and a surface of the base layer exposed with removal of the emitter layer;

removing the first conductor film formed in the first conductor film forming step except for a portion formed along the edge of the cover film and the side surface of the emitter layer and also removing a part of the base layer to expose the collector layer;

forming an insulating film on the opposite sides of the first conductor film left in the removing step such that a top edge of the left first conductor film is exposed; and forming a second conductor film on the surface of the insulating film formed in the insulating film forming step along the exposed top edge of the left first conductor film.

This method permits formation of a longitudinal bipolar transistor which has an extremely reduced external base region and which has reduced base-collector junction capacitance.

According to a further aspect of the invention, there is provided a semiconductor device, which comprises:

a semiconductor substrate;

a first conductor film extending from a surface of the semiconductor substrate in a direction substantially at right angles to the surface;

a first insulating film formed on the surface of the semiconductor substrate and in contact with one surface of the first conductor film;

a second insulating film formed on the surface of the semiconductor substrate and in contact with the other surface of the first conductor film;

a second conductor film formed on surfaces of the first and the second insulating films and in contact with a top edge of the first conductor film;

a third conductor film formed on the surface of the semiconductor substrate at a position to sandwich the first insulating film with the first conductor film; and a fourth conductor film formed on the surface of the semiconductor substrate at a position to sandwich the second insulating film with the first conductor film.

With the semiconductor device of this structure, the gate electrode resistance can be suppressed to be low by the second conductor film in spite of extremely small gate length.

Suitably, the semiconductor substrate has a surface layer in ohmic contact with a conductor and a deeper layer in Schottky contact with a conductor, and the semiconductor substrate surface has a recess which penetrates the surface layer in ohmic contact with the conductor and which reaches the deeper layer in Schottky contact with the conductor.

In this semiconductor device, the source electrode and the drain electrode are in ohmic contact with the semiconductor substrate, and the gate electrode is in Schottky contact with the substrate. Thus, it is possible to obtain an FET having an extremely short gate electrode length.

Further, in this case, suitably, the semiconductor substrate includes a layer in ohmic contact with a conductor, a high impurity concentration layer and a low impurity concentration layer, these layers being provided in the mentioned order from the surface toward the depth, and the recess has a depth such that it penetrates the layer in ohmic contact with the conductor and the high impurity concentration layer to reach the low impurity concentration layer.

According to a further aspect of the invention, there is provided a semiconductor device, which comprises:

a semiconductor substrate including a collector layer, an island-like base layer formed therein, and an emitter layer having an island-like shape corresponding to the island-like base layer except for an edge portion thereof and projecting from the base layer;

a first conductor film extending from the surface of the island-like base layer in the edge portion thereof substantially at right angles to the surface;

a first insulating film formed on the surface of the semiconductor substrate and in contact with an inner side surface of the first conductor film;

a second insulating film formed on the surface of the semiconductor substrate and in contact with an outer side surface of the first conductor film;

a second conductor film formed on surfaces of the first and the second insulating films and in contact with a top edge of the first conductor film;

a third conductor film in contact with the emitter layer; and a fourth conductor film in contact with the collector layer.

This semiconductor device, as a longitudinal bipolar transistor, has extremely reduced external base region.

The above and other objects, features and advantages of the invention will become more apparent from the following detailed description of the preferred embodiments when the same is read with reference to the accompanying drawings.

DETAILED DESCRIPTION OF THE PREFERRED EMBODIMENTS

Figure 1:
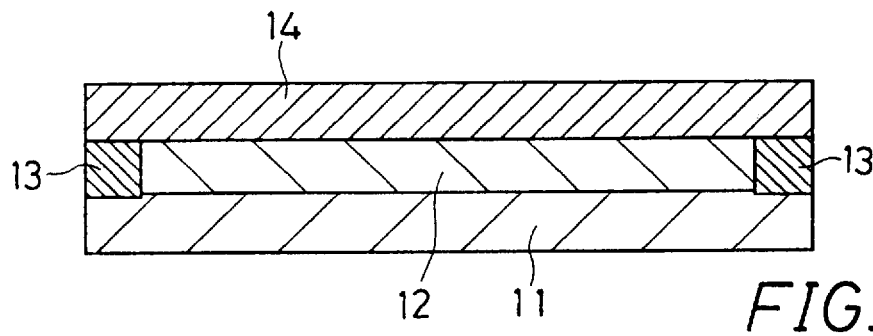
FIG. 1 is a sectional view showing a step in a first embodiment of the invention.

FIGS. 1 to 9 show individual steps of the method according to a first embodiment of the invention. As shown in FIG. 1, an n-type GaAs layer 12 is formed on a semi-insulating GaAs substrate 11. A portion of the n-type GaAs layer 12 near the surface thereof has high impurity concentration. Thus, when a specific metal film such as AuGe/Ni/Au or WSi is formed on the surface and sintered, the metal film is in ohmic contact with the high impurity concentration layer. On the other hand, a deeper portion of the layer 12 has low impurity concentration. Therefore, the specific metal film such as AuGe/Ni/Au or WSi formed on a deeper surface of the layer 12 and sintered is held in Schottky contact with and not in ohmic contact with the low impurity concentration layer. Subsequently, a high resistant element isolation region 13 is formed in an intended portion of the n-type GaAs layer 12 by causing ion implantation of boron from the surface of the layer 12. Then, a silicon oxide layer 14 is formed by a CVD to cover the n-type GaAs layer 12 and the element isolation region 13. The silicon oxide layer 14 covers a surface of the semiconductor substrate composed of the GaAs layer 12 and the GaAs substrate 11.

Figure 2:
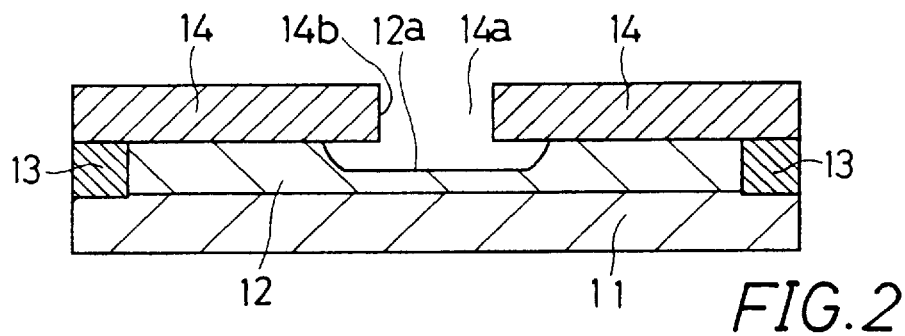
FIG. 2 is a sectional view showing a step subsequent to the step shown in FIG. 1.

Then, as shown in FIG. 2, the silicon oxide layer 14 is formed with an aperture or hole 14*a*. In this state, the silicon oxide film 14 exposes a part of the semiconductor substrate surface and covers the rest thereof. In addition, an edge 14*b* is formed along a boundary between the covered portion and the exposed portion. Subsequently, the n-type GaAs layer 12 is isotropically etched (i.e., recessedly etched) from the hole 14*a* with the cover silicon oxide film 14 used as a mask, thus forming a recess 12*a*. The recess 12*a* is adjusted in depth such that it penetrates the high impurity concentration layer in ohmic contact with the conductor and reaches the low impurity concentration layer in Schottky contact with the conductor.

Figure 3:
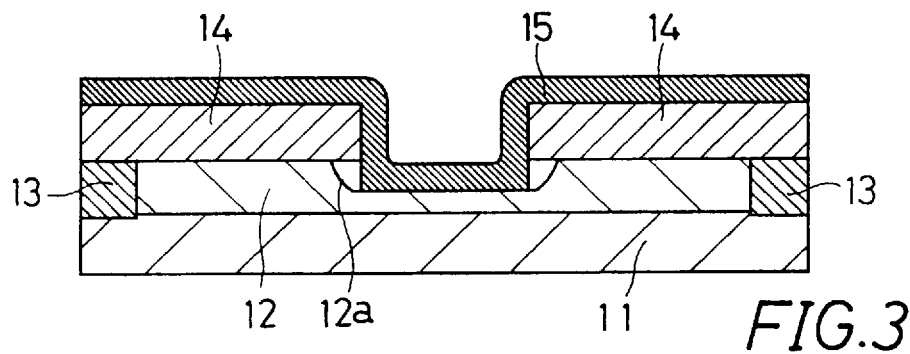
FIG. 3 is a sectional view showing a step subsequent to the step shown in FIG. 2.

Subsequently, as shown in FIG. 3, a WSi film 15 is formed by spattering as a first conductor film such that it covers the upper surface of the wafer shown in FIG. 2. At this time, the first conductor film or WSi film 15 is formed in a range from the surface of the cover film 14 through the edge 14*b* to the exposed surface of the semiconductor substrate 12.

Figure 4:
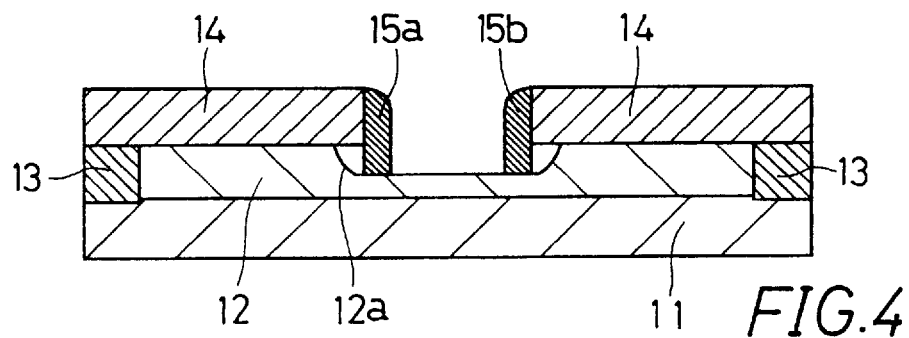
FIG. 4 is a sectional view showing a step subsequent to the step shown in FIG. 3.

Then, as shown in FIG. 4, a portion of the WSi film 15 other than portions (side wall portions) 15*a* and 15*b* along the edge 14*b* of the silicon oxide layer (cover film) 14 is removed by anisotropic dry etching. Thereafter, the silicon oxide film 14 is removed.

Figure 5:
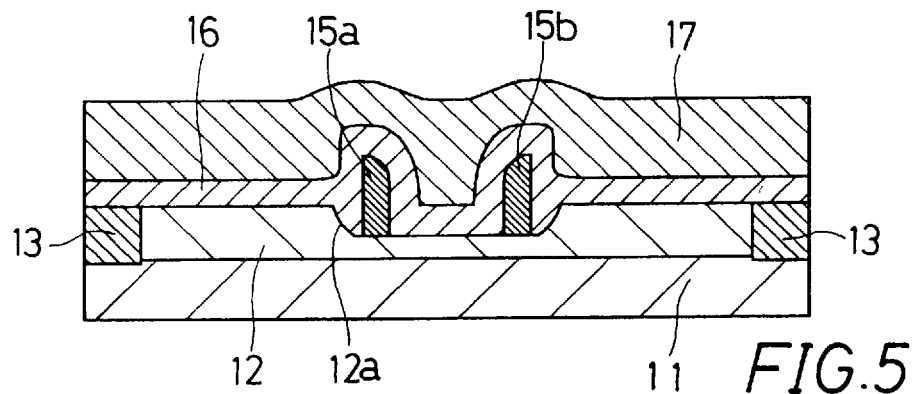
FIG. 5 is a sectional view showing a step subsequent to the step shown in FIG. 4.

Then, as shown in FIG. 5, a silicon oxide film 16 is formed by the CVD such that it covers the upper surface of the resultant wafer. Then, a resist layer 17 is formed by coating the upper surface of the silicon oxide layer 16.

Figure 6:
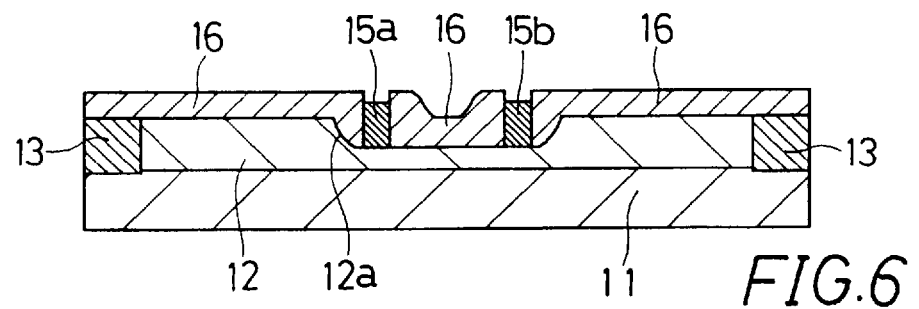
FIG. 6 is a sectional view showing a step subsequent to the step shown in FIG. 5.

Then, as shown in FIG. 6, the silicon oxide layer 16 and the resist layer 17 are etched back to expose the upper surface of the side wall portions 15*a* and 15*b*. In this state, an insulating film is formed on the opposite sides of the side wall portions 15*a* and 15*b* such that the top edge of the side wall portions 15*a* and 15*b* are exposed.

Figure 7:
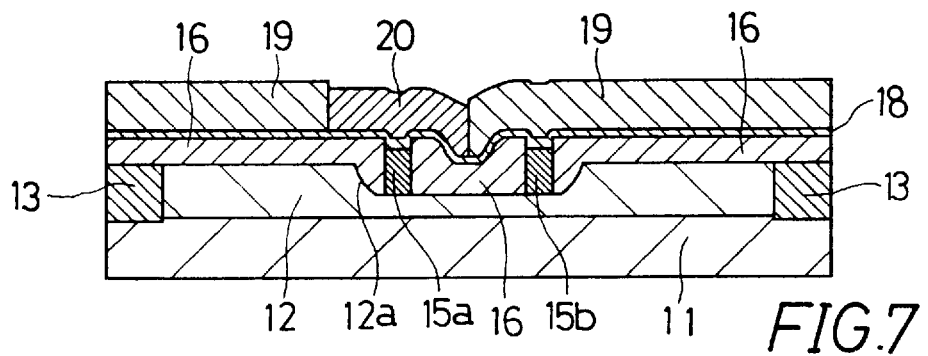
FIG. 7 is a sectional view showing a step subsequent to the step shown in FIG. 6.

Then, as shown in FIG. 7, a plating ground metal film (Ti/Pt/Au) 18 is deposition formed on the upper surface of the wafer shown in FIG. 6. Further, a resist layer 19 is formed to cover a predetermined portion of the plating ground metal film 18, and with the resist layer 19 used as a mask, a plated Au layer 20 is formed in a window of the resist layer 19. The window and the Au layer 20 are located at a region corresponding to the side wall portion 15*a*. The plated Au layer 20 is connected as a second conductor film to the first conductor film 15*a*, through the plating ground metal film 18.

Figure 8:
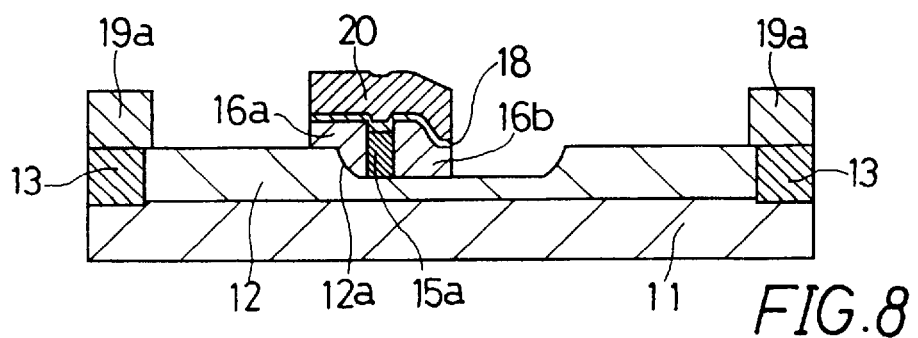
FIG. 8 is a sectional view showing a step subsequent to the step shown in FIG. 7.

Then, as shown in FIG. 8, the resist layer 19 is removed, and further, with the plated Au layer 20 used as a mask, the plating ground metal film 18 is ion etched. Further, the silicon oxide layer 16 and the side wall portion 15*b* are removed by dry etching. At this time, the surface of the semiconductor substrate 12 is exposed on the right and left sides of the second conductor film 20. Subsequently, a resist layer 19*a* is formed to cover the upper surface of the element isolation region 13 and the adjacent portions of the n-type GaAs layer 12.

Figure 9:
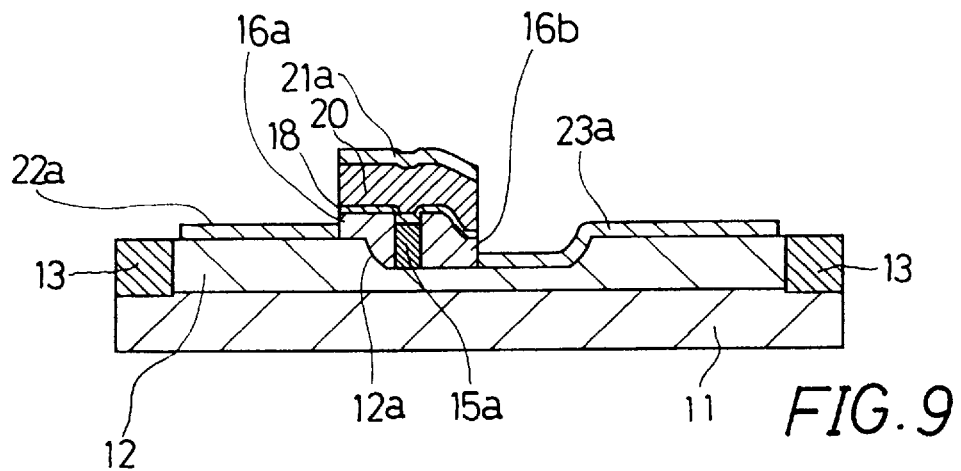
FIG. 9 is a sectional view showing a step subsequent to the step shown in FIG. 8.

Then, as shown in FIG. 9, with the resist layer 19a used as a mask and through lift-off, a gate electrode upper portion 21a, a source electrode 22a and a drain electrode 23a consisting of an AuGe/Ni/Au layer are deposition formed. Subsequently, the resist layer 19a is removed and the wafer shown in FIG. 9 is sintered. At this time, the source electrode 22a is a third conductor film, and the drain electrode 23a is a fourth conductor film.

The above structure permits an extreme reduction of the length of the gate electrode stem portion (side wall portion of the WSi film) 15a by the side wall process. Further, since a T-shaped gate electrode is formed with a wide upper portion 21a thereof connected to the stem portion 15a, it is possible to reduce the gate electrode resistance.

Further, since the height of the stem portion 15a can be set to 1 µm or above, the electrostatic capacitance between the upper portion 21a of the gate electrode and the n-type GaAs layer 12 can be reduced to provide satisfactory high frequency characteristic. Further, since the stem portion 15a of the gate electrode and the recess 12a of the n-type GaAs layer 12 can be formed in self-alignment (that is, both are formed with the cover layer 14 having a window or a hole 14a as a mask), their position errors can be extremely reduced. It is thus possible to set an accurate and small distance between the source electrode 22a and the gate electrode 15a, thus permitting reduction of source resistance.

Furthermore, the effective distance between the stem portion 15a of the gate electrode and the drain electrode 23a to be greater than the distance between the source electrode and the gate electrode, thus permitting increase of the breakdown voltage between the gate electrode and the drain electrode. Further, it is possible to make the impurity concentration in the drain region to be lower than that in the source region. This again permits increase of the breakdown voltage between the gate electrode and the drain electrode.

Figure 10:
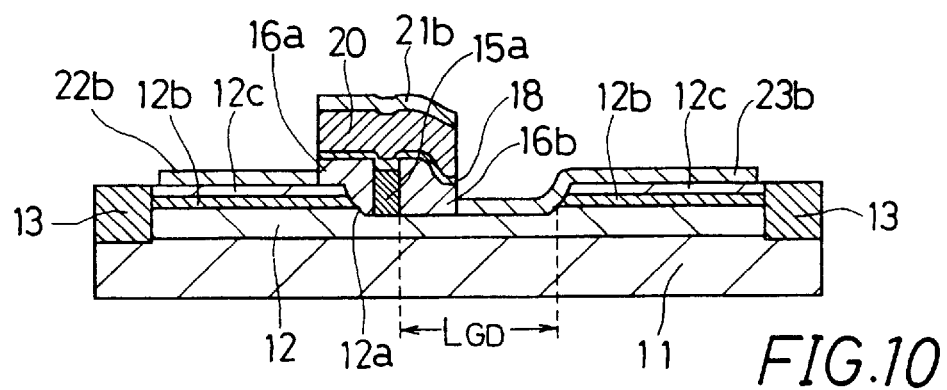
FIG. 10 is a sectional view showing a modification of the first embodiment.

FIG. 10 shows a modification of the preceding first embodiment. Referring to FIG. 10, an n$^+$-type GaAs layer 12b is formed on the top surface of the n-type GaAs layer 12, and an InGaAs layer 12c is formed on the top surface of the n$^+$-type GaAs layer 12b. The InGaAs layer 12c is in ohmic contact with metal film without any sintering process. The n$^+$-type GaAs layer 12b is a high impurity concentration layer. The n-type GaAs layer 12 is a low impurity concentration layer and is in Schottky contact with metal layer. The recess 12a penetrates the InGaAs layer 12c in ohmic contact with the conductor and the high impurity concentration layer 12b and reaches the low impurity concentration layer 12. A source electrode 22b and a drain electrode 23b are deposition formed on the top surface of the InGaAs layer 12c. An upper portion 21b of the gate electrode is deposition formed on the top surface of the plated Au layer 20. The individual electrodes 21b, 22b and 23b are made of Ti/Pt/Au, but this material is not limitative. In this case, no sintering is necessary.

In the above structure, the source electrode 22b and the drain electrode 23b are in ohmic contact with the top surface of the InGaAs layer 12c without sintering. However, since the n-type GaAs layer 12 in the recess 12a and the drain electrode 23b are in Schottky contact, the effective distance between the gate electrode and the drain electrode is $L_{GD}$. It is thus possible to improve the breakdown voltage between the gate electrode and the drain electrode.

In the previous first embodiment, the silicon oxide layer 14 may be replaced with a photo-resist layer. In this arrangement, it is possible to use the photo-resist layer as a mask when recess etching the n-type GaAs layer 12. At this time, it is readily possible to form an perpendicular side wall of the aperture or hole in the photo-resist layer. It is further possible to form an inversely tapered side wall of the hole (i.e., a state with a broader bottom of the hole than the top thereof). Further, it is possible to remove damage that may otherwise be received by the channel part as a result of reactive ion etching (RIE) for forming the hole in the silicon oxide film 14 as a mask.

Further, in the above first embodiment, after forming the above WSi side wall portions 15a and 15b and removing the silicon oxide film 14, the surfaces of the WSi side wall portions 15a and 15b are suitably etched again by anisotropic dry etching. By doing so, portions of the WSi side wall portions 15a and 15b extending to the recess side are removed, and thus the WSi side wall portions 15a and 15b as a gate electrode are no longer in contact with the source region. Thus, the breakdown voltage between the source region and the gate electrode, which was 1 V before the repeated anisotropic dry etching, becomes 5 V or above after the repeated anisotropic dry etching.

Such repeated anisotropic dry etching is applicable to a fourth embodiment to be described later after base electrode formation to obtain the same effects.

Further, in the above first embodiment, after forming the WSi side wall portions 15a and 15b and removing the silicon oxide film 14, the surface of the n-type GaAs layer 12 may be etched to obtain the same effects as those obtainable with the above repeated anisotropic dry etching.

Further, by applying such etching to the fourth embodiment described later after base electrode formation, it is possible to obtain the same effects.

Figure 11:
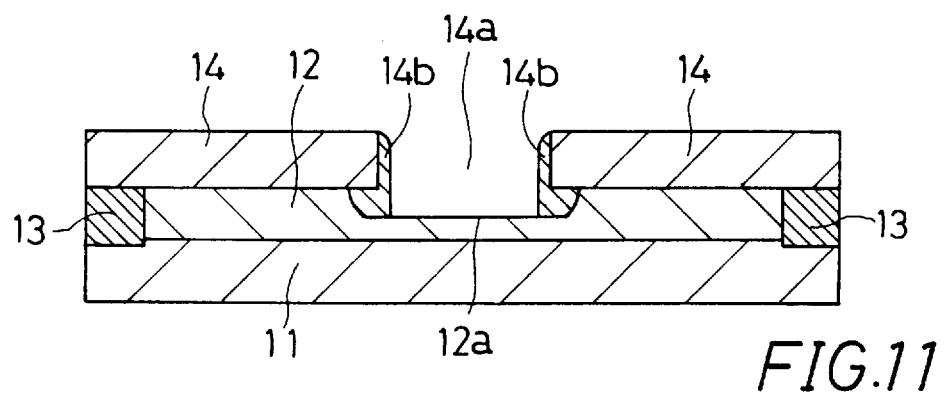
FIG. 11 is a sectional view showing a different modification of the first embodiment.
Figure 12:
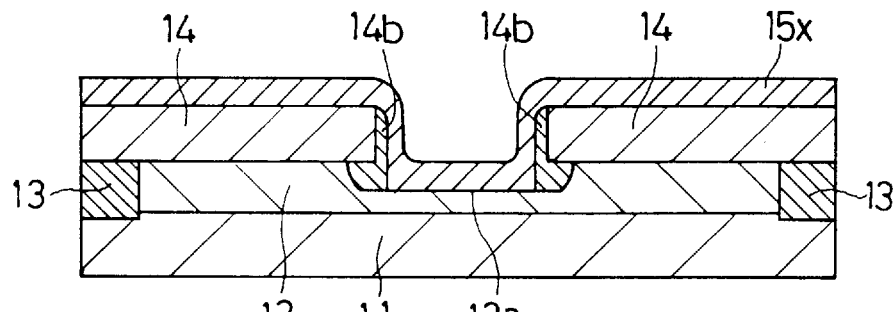
FIG. 12 is a sectional view showing a further modification of the first embodiment.
Figure 13:
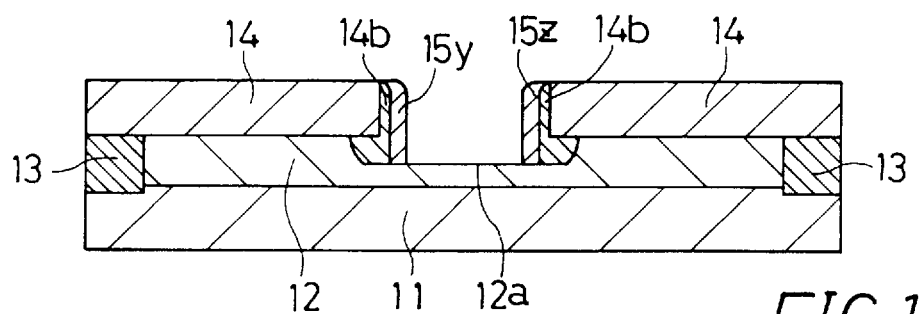
FIG. 13 is a sectional view showing a step subsequent to the step shown in FIG. 12.

FIGS. 11 to 13 illustrate a further modification of the first embodiment. FIG. 11 corresponds to FIG. 2 noted above, FIG. 12 corresponds to FIG. 3 noted above, and FIG. 13 corresponds to FIG. 4 noted above.

First, as shown in FIG. 11, after a recess 12a is formed by etching in an n-type GaAs layer 12, a silicon oxide side wall 14b is formed in a hole 14a of a silicon oxide layer 14. This silicon oxide side wall 14b is a second cover layer formed along the side wall of the recess 12a and the edge of the cover film 14.

Then, as shown in FIG. 12, a WSi film 15x is formed by spattering to cover the upper surface of the wafer shown in FIG. 11. Then, as shown in FIG. 13, WSi side wall portions 15y and 15z are formed through anisotropic dry etching of the WSi film 15x.

In this case, when the recess side etching is done over a large extent in case of a recess depth (depth of the recess 12a) as great as 100 nm or above, the clearance or space formed by the side etching is perfectly filled by the above silicon oxide side wall (second cover film) 14b, and thus, there is no possibility of separation of the WSi side wall portions 15y and 15z. Additionally, it is possible to improve the breakdown voltage between the source region and the gate electrode. Further, the silicon oxide side wall is applicable as well to base electrode formation in the fourth embodiment to be described later.

Figure 14:
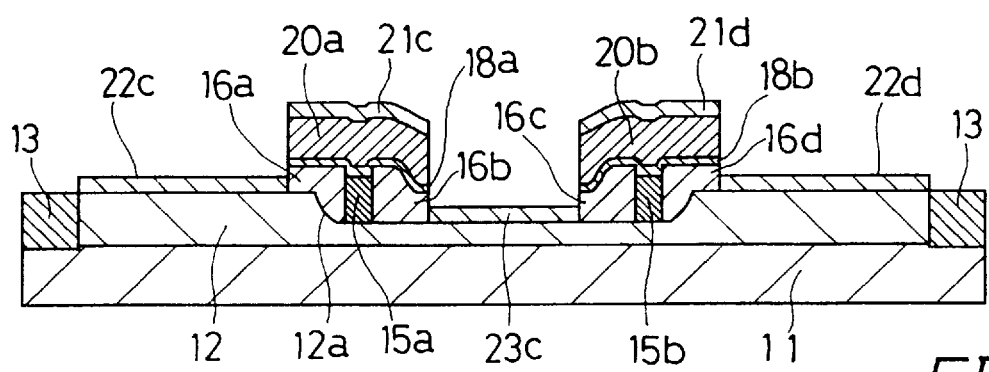
FIG. 14 is a sectional view showing a second embodiment of the invention.
Figure 15:
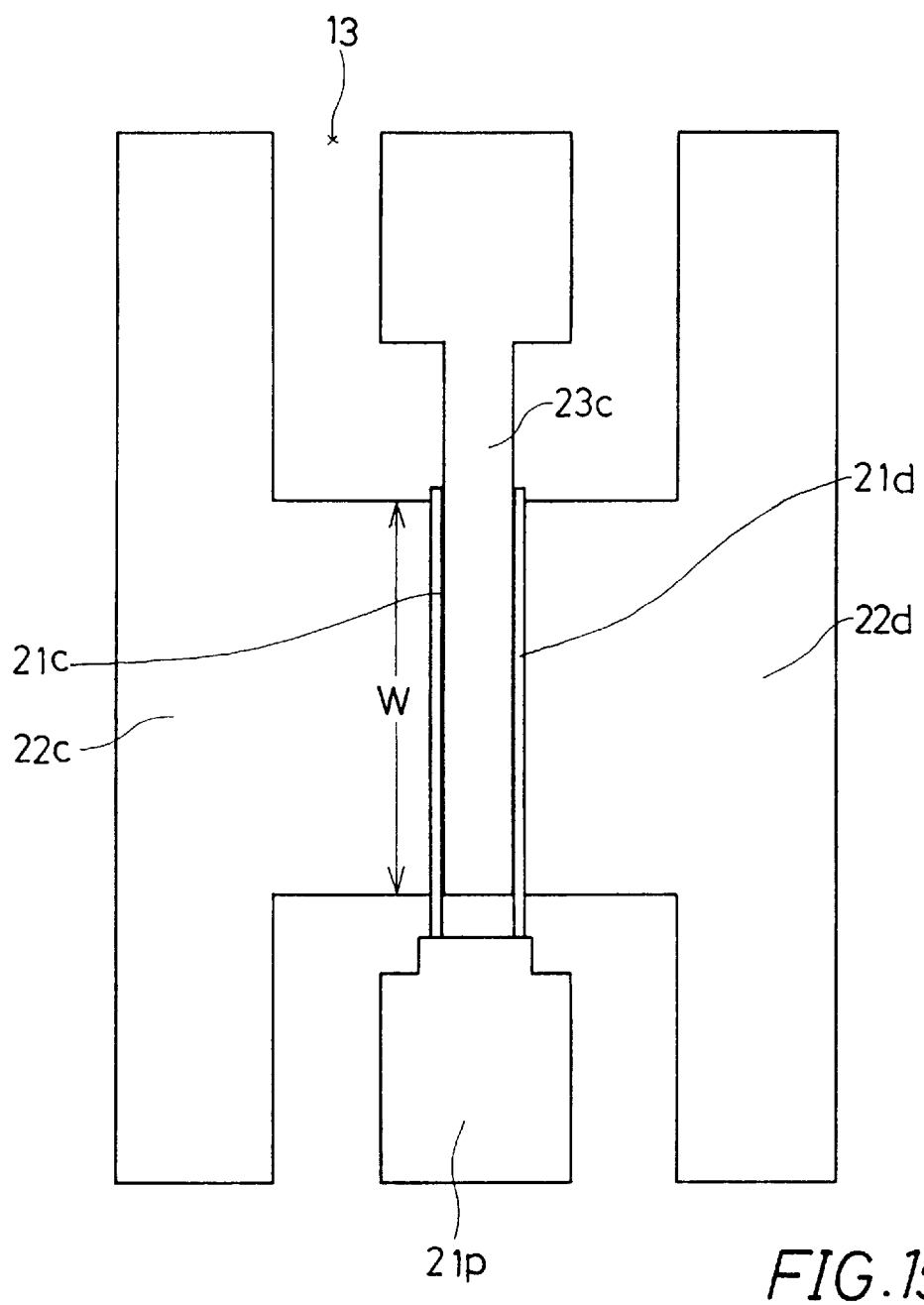
FIG. 15 is a plan view showing the second embodiment.

FIG. 14 is a sectional view showing a second embodiment of the invention, and FIG. 15 is a plan view showing the structure in the second embodiment. Referring to FIGS. 14 and 15, designated at 21c is a first gate electrode, at 21d a second gate electrode, at 22c a first source electrode, at 22d a second source electrode, and at 23c a common drain electrode. An upper portion 21c of the first gate electrode and an upper portion 21d of the second gate electrode are connected to each other by a single lead layer 21p for gate electrodes. In other words, a pair of first conductor films 15a and 15b are connected to each other by a single second conductor film.

Thus, the gate width W is effectively doubled. In addition, the common drain electrode 23c is formed through lift-off between upper portions of the gate electrodes 21c and 21d. Thus, no margin is necessary for mask alignment of the drain electrode 23c and the upper portions of the gate electrodes 21c and 21d to one another, thus permitting improvement of the integration degree of the integrated circuit in which the FET shown in FIGS. 14 and 15 is assembled.

Further, in the first embodiment, as shown in FIG. 8, when removing the WSi side wall portion 15b, the rate of etching of the WSi side wall portion 15b may be higher than that of the silicon oxide layer 16 depending on etching conditions. Therefore, the WSi side wall portion 15b may be etched earlier than the silicon oxide layer 16 to result in deterioration of the channel section (i.e., portion right under the recess 12a). The second embodiment is free from such deterioration of the channel section because the WSi side wall portion 15b is not removed.

Figure 16:
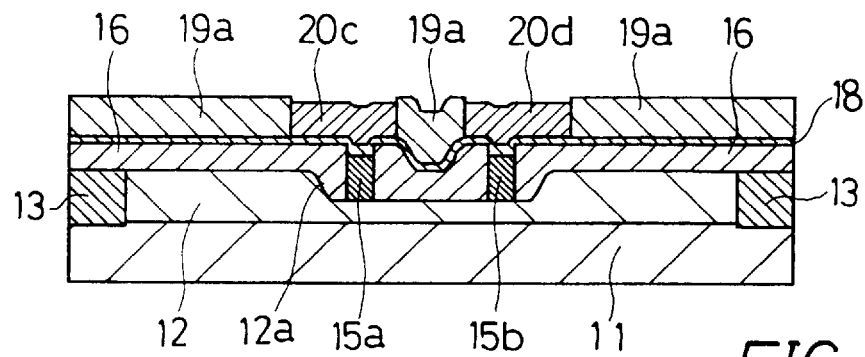
FIG. 16 is a sectional view showing a step in a third embodiment of the invention.
Figure 17:
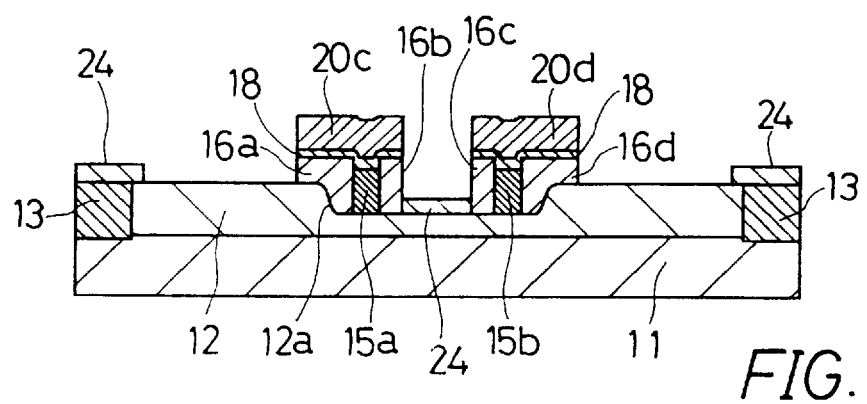
FIG. 17 is a sectional view showing a step subsequent to the step shown in FIG. 16.
Figure 18:
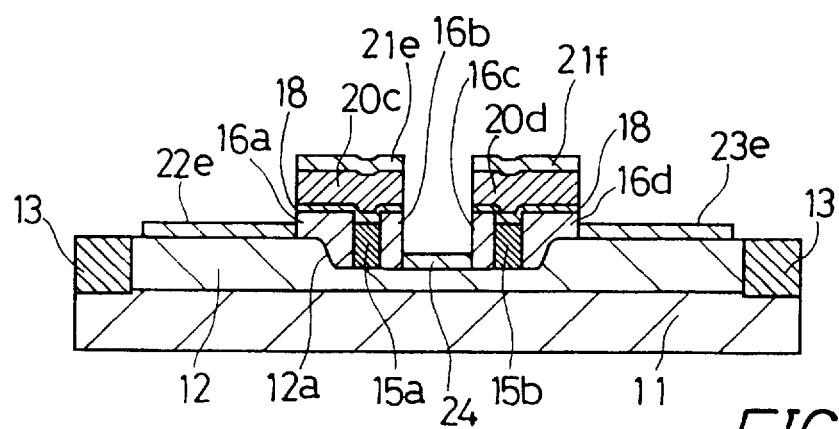
FIG. 18 is a sectional view showing a step subsequent to the step shown in FIG. 17.

FIGS. 16 to 18 illustrate a process of manufacturing a duel gate type FET as a third embodiment of the invention. FIG. 16 corresponds to FIG. 7 concerning the above first embodiment. In the case of FIG. 16, both side wall portions 15a and 15b of the WSi film 15 are used as a gate electrode. To this end, a plated Au layer 20c is formed with a coated resist layer 19a used as a mask such that it is connected to the side wall portion 15a via a plated ground metal film 18, and a plated Au layer 20d is formed such that it is connected to the side wall portion 15b via the plating ground metal film 18.

Then, as shown in FIG. 17, the resist layer 19a is removed, and then the plating ground metal film 18 is ion milled with the plated Au layers 20c and 20d used as a mask. Further, the silicon oxide layer 16 is dry etched. Subsequently, a resist layer 24 is formed to cover opposite end portions of the upper surface of the wafer shown in FIG. 16 (i.e., element isolation region 13) and a portion of the surface between the gate electrodes.

Then, as shown in FIG. 18, an AuGe/Ni/Au layer is deposited with the resist layer 24 used as a mask, and using the lift-off process, an upper portion 21e of the first gate electrode is formed on the plated Au layer 20c, an upper portion 21f of the second gate electrode is formed on the plated Au layer 20d, and a source electrode 22e and a drain electrode 23e are formed on the n-type GaAs layer 12. The system is then sintered.

With the above structure, the length of stem portions (i.e., portions in Schottky connection to the channel section) 15a and 15b of the upper portions 21e and 21f of the gate electrodes can be extremely reduced because these portions 15a and 15b are side walls obtained by anisotropic etching. It is thus possible to make the duel gate type FET finer. In this case, a pair of second conductor films 20c and 20d are provided in correspondence to and connected to the respective first conductor films 15a and 15b as a pair.

Figure 19:
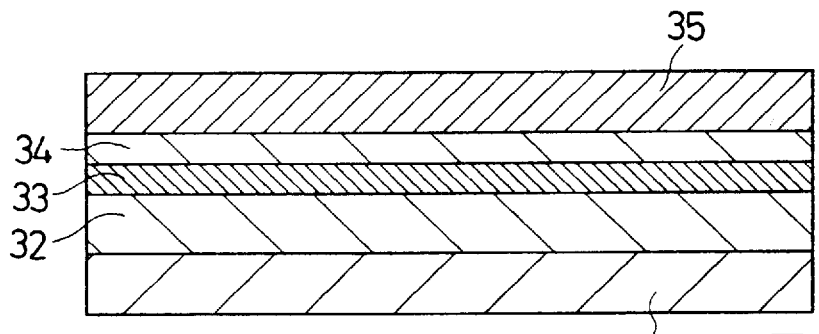
FIG. 19 is a sectional view showing a step in a fourth embodiment of the invention.

FIGS. 19 to 27 illustrate a fourth embodiment of the invention applied to a process of manufacturing a heterojunctionbipolar transistor. First, as shown in FIG. 19, an n-type GaAs collector layer 32, a p$^+$-type AlGaAs base layer 33 and an n-type AlGaAs emitter layer 34 are formed successively on a semi-insulating GaAs substrate 31. The layers 34, 33 and 32 constitute a semiconductor substrate. Further, a silicon oxide layer 35 is formed through the CVD on the emitter layer 34.

Figure 20:
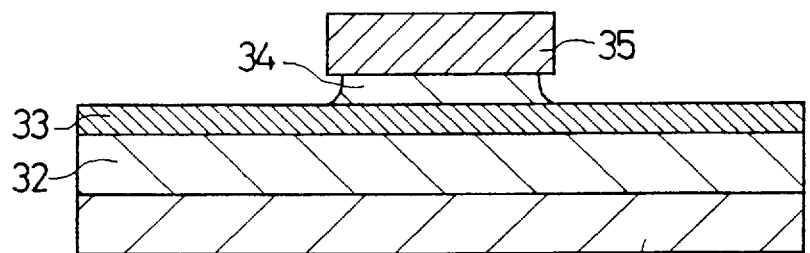
FIG. 20 is a sectional view showing a step subsequent to the step shown in FIG. 19.

Then, as shown in FIG. 20, the silicon oxide layer 35 is etched to produce a state in which the silicon oxide layer 35 exposes the surface of a portion of the semiconductor substrate and covers the island-like remaining portion thereof. Subsequently, the emitter layer 34 is isotropically etched with the silicon oxide layer 35 used as a mask.

Figure 21:
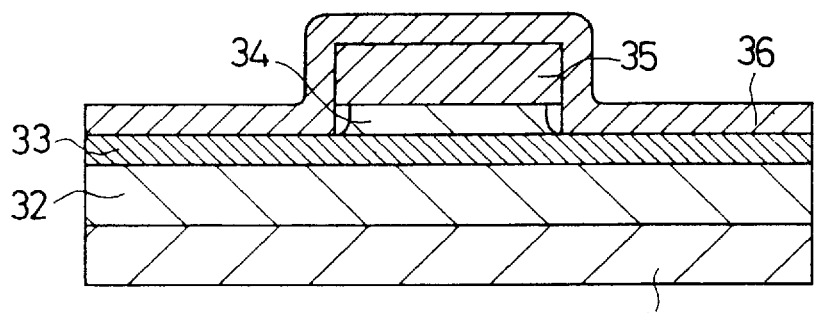
FIG. 21 is a sectional view showing a step subsequent to the step shown in FIG. 20.

Then, as shown in FIG. 21, a WSi film 36 is formed by spattering such as to cover the upper surface of the wafer shown in FIG. 20.

Figure 22:
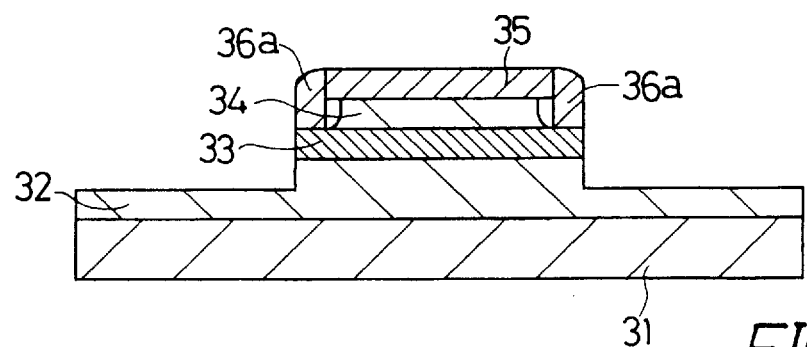
FIG. 22 is a sectional view showing a step subsequent to the step shown in FIG. 21.

Then, as shown in FIG. 22, the WSi film 36 is etched by anisotropic dry etching such as to leave only a side wall portion 36a along the side wall of the silicon oxide layer 35 and the side wall of the emitter layer 34. Subsequently, the base layer 33 and the collector layer 32 are etched with the side wall portion 36a and the silicon oxide film 35 used as a mask. Thus, the island-like base layer 33 is formed on the collector layer 32, and the island-like emitter layer 34 is formed on a portion of the base layer region 33 other than an edge portion thereof. The emitter layer 34 projects from the base layer 33. The side wall portion (first conductor film) 36a is formed along an edge portion of the island-like base layer 33 and along the side wall of the island-like emitter layer 34.

Figure 23:
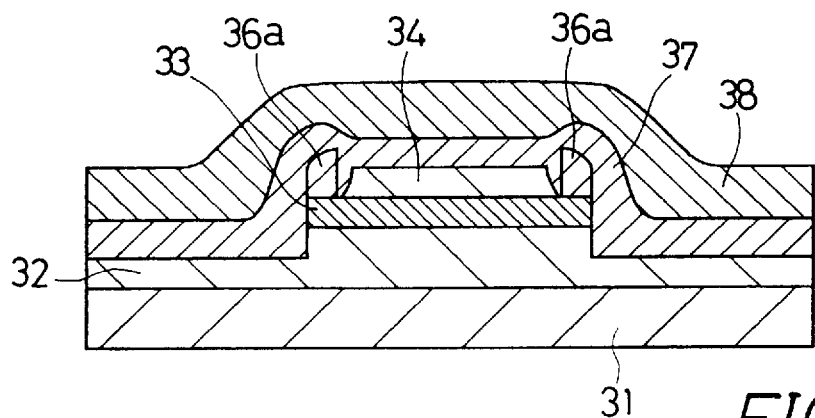
FIG. 23 is a sectional view showing a step subsequent to the step shown in FIG. 22.

Then, as shown in FIG. 23, a silicon oxide layer 37 is formed through the CVD such as to cover the upper surface of the wafer shown in FIG. 22. Then, a resist layer 38 is formed by coating to cover the upper surface of the silicon oxide layer 37.

Figure 24:
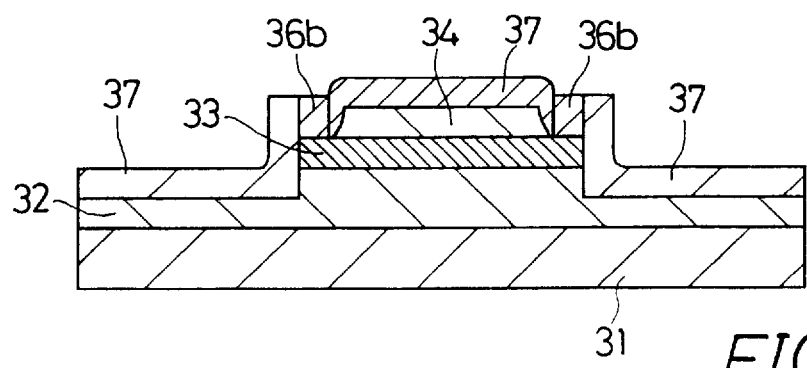
FIG. 24 is a sectional view showing a step subsequent to the step shown in FIG. 23.

Then, as shown in FIG. 24, the upper surface side of the wafer shown in FIG. 23 is etched back. As a result, the WSi layer (first conductor film) 36a has its upper portion etched back to become a WSi layer 36b. At the same time, the silicon oxide layer 37 is etched back, and the resist layer 38 is completely removed. At this time, insulating films 37 are formed on the inner and outer sides of the first conductor film 36b such that the top edge of the first conductor film 36b is exposed.

Figure 25:
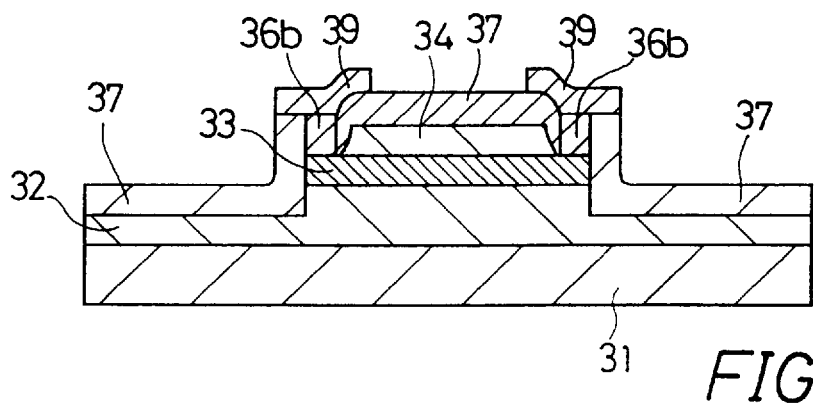
FIG. 25 is a sectional view showing a step subsequent to the step shown in FIG. 24.

Then, as shown in FIG. 25, an upper portion 39 of a Ti/Pt/Au base electrode is deposition formed such as to be connected to the top edge of the WSi layer 36b. This Ti/Pt/Au layer or a second conductor film is formed on the top surface of the insulating film 37 and extends along the top edge of the first conductor film 36b.

Figure 26:
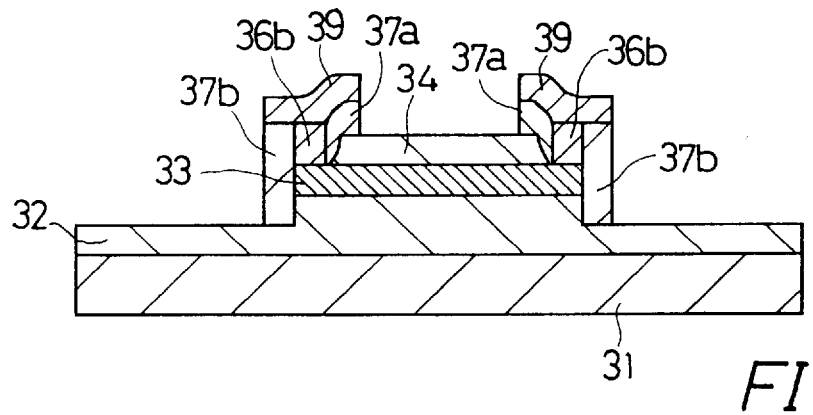
FIG. 26 is a sectional view showing a step subsequent to the step shown in FIG. 25.

Then, as shown in FIG. 26, the silicon oxide layer 37 is anisotropically etched with the base electrode upper portion (second conductor film) 39 used as a mask. Thus, of the silicon oxide film 37, only upright portions 37a and 37b are left such as to sandwich the WSi layer 36b.

Figure 27:
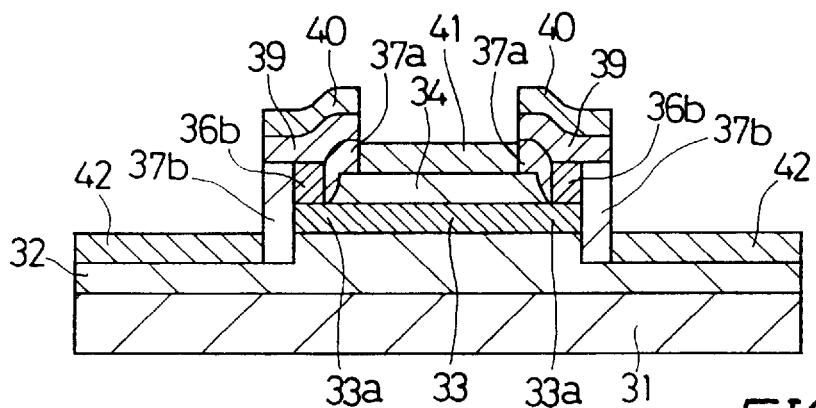
FIG. 27 is a sectional view showing a step subsequent to the step shown in FIG. 26.

Then, as shown in FIG. 27, by deposition forming an AuGe/Ni/Au layer, a base electrode upper portion 40, an emitter electrode 41 and a collector electrode 42 are formed, and they are sintered. The base electrodes 30 and 40, the emitter electrode 41 and the collector electrode 42 are insulated from each other by varying the height thereof.

Of the base layer 33, a lower portion of the WSi layer 36b constitutes an external base region 33a. The external base region 33a causes increase of base resistance. However, since the WSi layer 36b is formed adjacent to and in self-alignment to the emitter region 34, it is possible to extremely reduce the distance between the base electrode and the emitter region, thus permitting great reduction of the external base region 33a.

With the above structure, the external base region 33a is limited substantially to a region in contact with the stem portion 36b of the base electrode. The stem portion 36b has a width readily set to the order of sub-quarter of $\mu$m because it is formed by side wall techniques. Thus, the external base region 33a can be greatly reduced, and as a result, the junction capacitance between the external base region 33a and the collector layer 32 can be greatly reduced. It is thus possible to improve the cut-off frequency $f_T$ without requiring the complicated and expensive ion implantation process which semi-insulates the collector layer 32 through implantation of oxygen, proton, etc. into the collector layer 32. The fourth embodiment as described is applicable to other longitudinal three-terminal elements as well.

In the above fourth embodiment, it is possible to use Zn-doped W as a material of the side wall portion 36b. In this case, Zn is diffused in the external base region 33a of the base layer, and thus it is possible to increase the doping impurity concentration in the external base region 33a. Thus, the resistance P of the external base region 33a, which is about $5\times10^{-6}$ $\Omega/cm^2$ when the side wall portion 36b is made of WSi, can be reduced to about $1\times10^{-6}$ $\Omega/cm^2$ when the side wall portion 36b is made of Zn-doped W.

Figure 28:
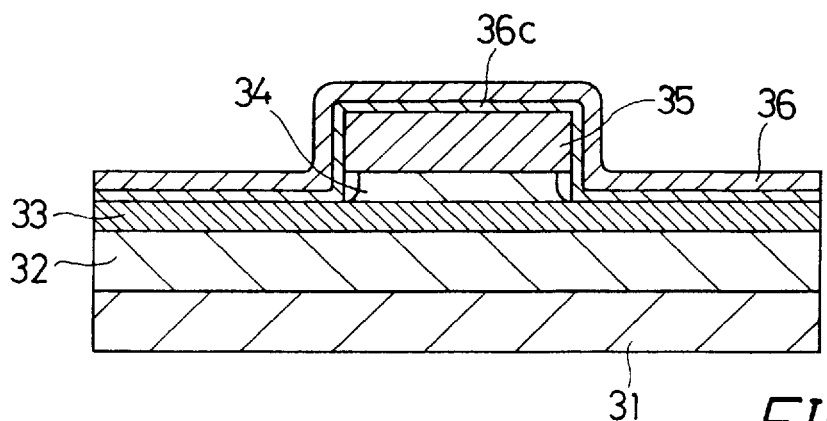
FIG. 28 is a sectional view showing a modification of the fourth embodiment.

FIG. 28 shows a modification of the fourth embodiment. FIG. 28 corresponds to FIG. 21 described above. In the case of FIG. 28, an AuZn film 36c is provided as ground metal under the WSi film 36. Other parts of the structure is the same as in FIG. 21.

Figure 29:
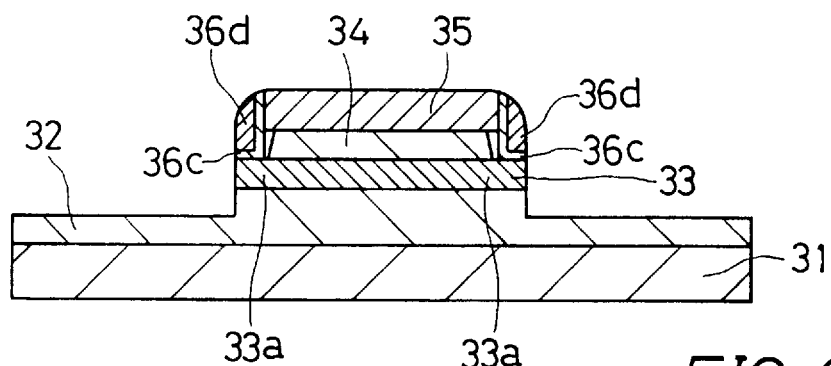
FIG. 29 is a sectional view showing a step subsequent to the step shown in FIG. 28.

Subsequently, as shown in FIG. 29, a WSi side wall portion 36d is formed through side wall etching of the WSi film 36. Then, the AuZn layer 36c is subjected to ion milling with the silicon oxide layer 35 and the WSi side wall portion 36d used as a mask, and further the base layer 33 and the collector layer 32 are etched.

Thus, since the AuZn layer 36c is present between the WSi side wall portion 36d formed as a side wall and the base layer 33, mutual diffusion (or alloying) between the external base region 33a and the AuZn takes place at the time of the sintering, thus reducing the base resistance ρ to about $1\times10^{-6}$ $\Omega/cm^2$.

FIGS. 30 to 35 illustrate a fifth embodiment of the invention applied to the formation of an emitter section of a vacuum micro-element with the side wall technique.

Figure 30:
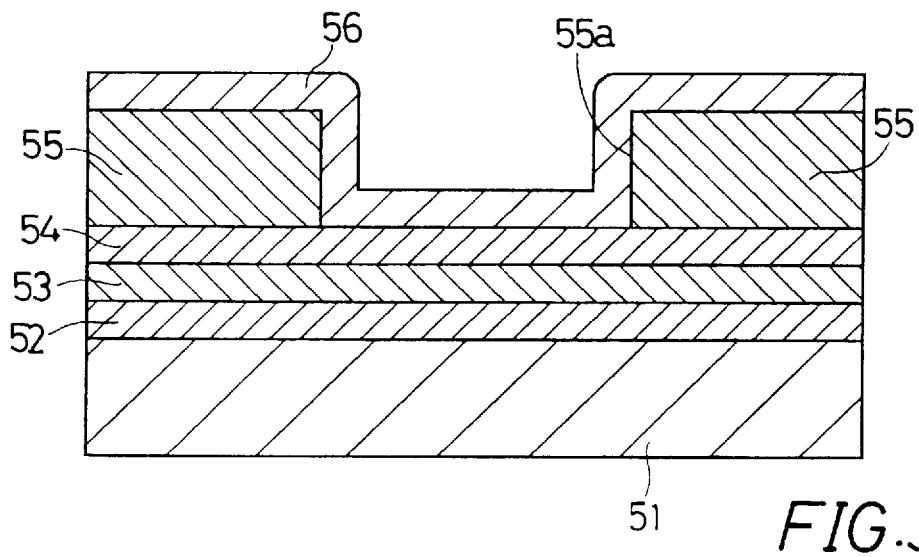
FIG. 30 is a sectional view showing a step in a fifth embodiment of the invention.

First, as shown in FIG. 30, a WSi film 52, a silicon oxide film 53 and a WSi film 54 are formed successively on an n⁺-type silicon substrate 51. Then, a silicon oxide layer 55 is formed on the WSi film 54, and an aperture or hole 55a is formed through etching in the silicon oxide layer 55. The silicon oxide layer 55 is a cover layer exposing a part of the semiconductor substrate surface and covering a remaining portion thereof. Then, a WSi film 56 is formed to cover the silicon oxide layer 55 and the WSi film 54 exposed in the hole 55a. The WSi film 56 is a first conductor film.

Figure 31:
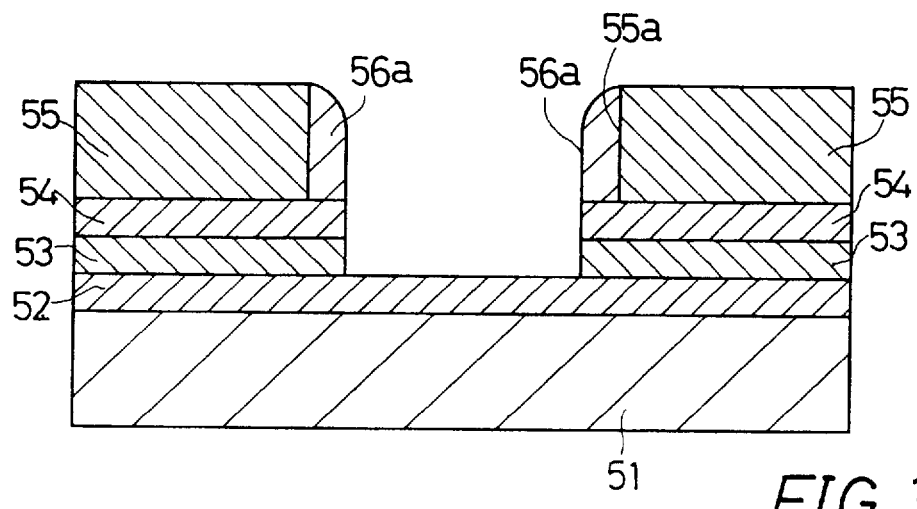
FIG. 31 is a sectional view showing a step subsequent to the step shown in FIG. 30.

Then, as shown in FIG. 31, a portion of the WSi film 56 other than a side wall portion 56a which is upright adjacent the side wall of the hole 55a is removed by anisotropic etching. At the same time, portions of the WSi film 54 and the silicon oxide film 53 in the hole 55a are removed.

Figure 32:
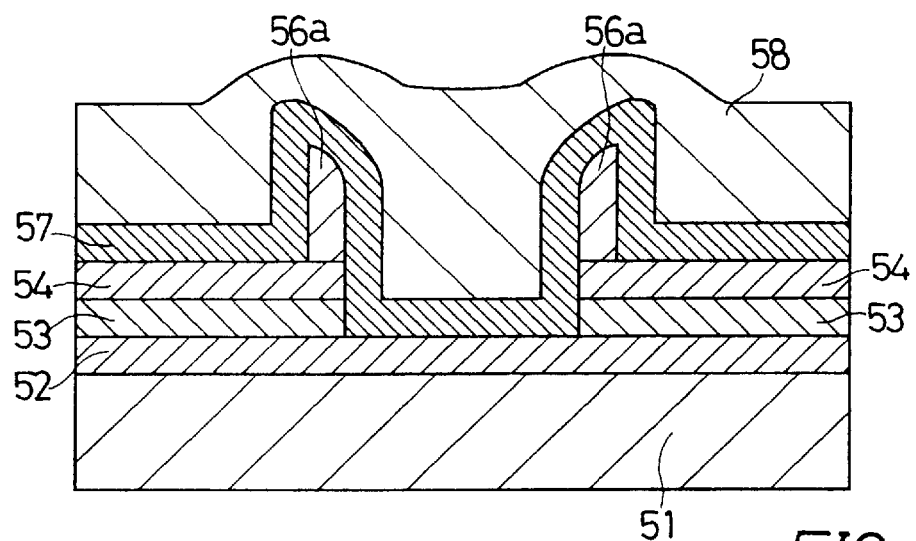
FIG. 32 is a sectional view showing a step subsequent to the step shown in FIG. 31.

Then, as shown in FIG. 32, the silicon oxide layer 55 is removed and a silicon oxide layer 57 is formed to cover the upper surface of the wafer shown in FIG. 31, and then, a resist layer 58 is coated on the silicon oxide layer 57.

Figure 33:
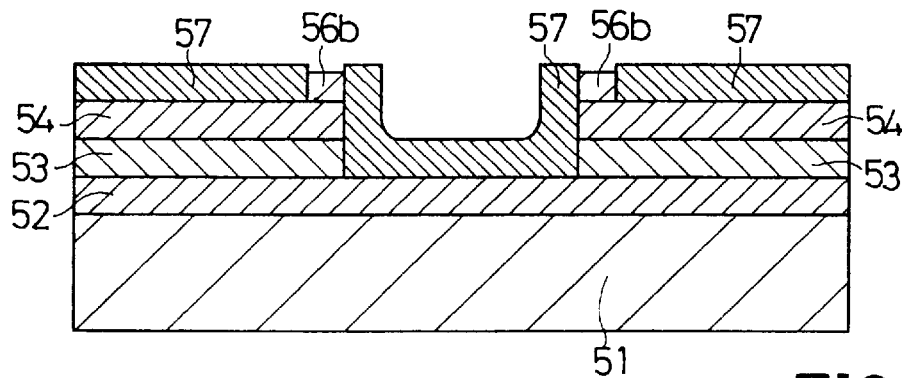
FIG. 33 is a sectional view showing a step subsequent to the step shown in FIG. 32.

Then, as shown in FIG. 33, an upper portion of the WSi side wall portion 56a is etched back to obtain a WSi film 56b. At the same time, the silicon oxide film 57 is etched back to completely remove the resist layer 58. In this state, an insulating film 57 is formed on the opposite sides of the remaining side wall portion 56b (a portion of the first conductor film). The top edge of the first conductor film 56b is exposed.

Figure 34:
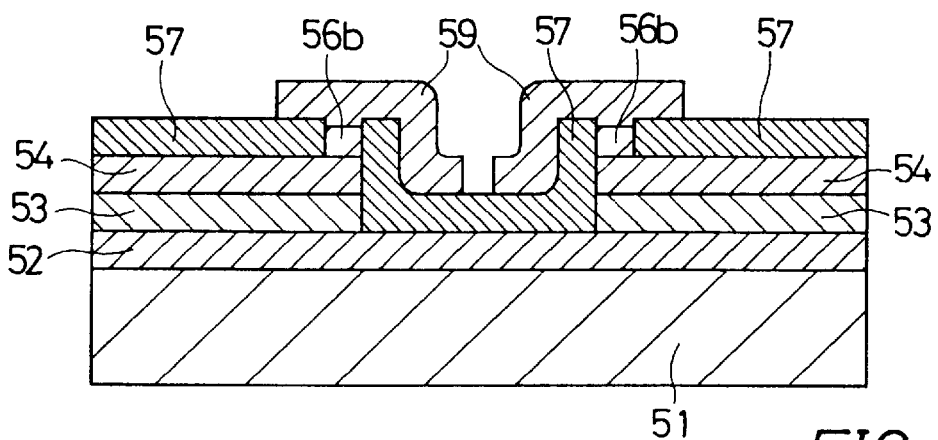
FIG. 34 is a sectional view showing a step subsequent to the step shown in FIG. 33.

Then, as shown in FIG. 34, a gate electrode 59 is formed through spattering on the insulating film 57 for connection to the WSi film 56b. The gate electrode is a second conductor film.

Figure 35:
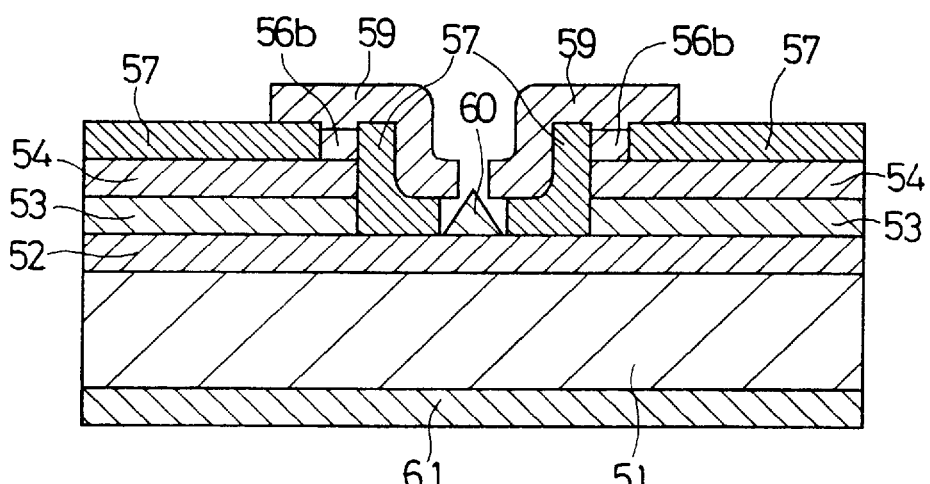
FIG. 35 is a sectional view showing a step subsequent to the step shown in FIG. 34.
Figure 36A:
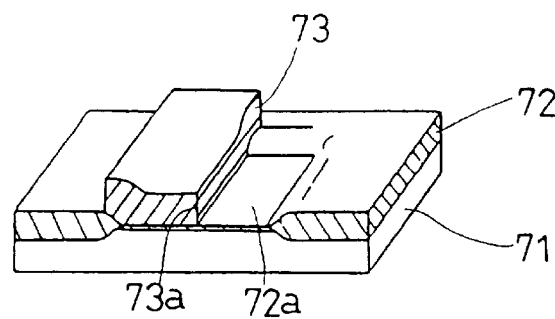
FIGS. 36(*a*) to 36(*d*) are views for describing a prior art example.
Figure 36B:
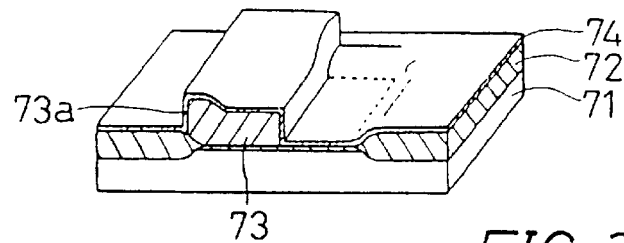
Figure 36C:
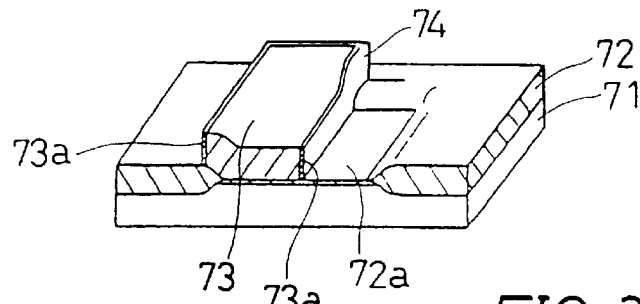
Figure 36D:
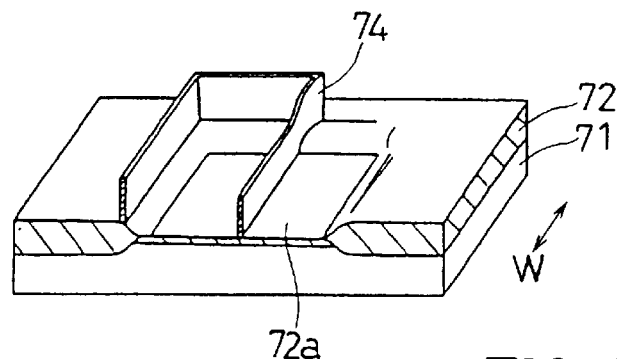

Then, as shown in FIG. 35, the silicon oxide layer 57 is etched with the gate electrode (second conductor film) 59 used as a mask. In a recess that is formed as a result of this etching, an emitter 60 (which is a third conductor film in this case) is deposition formed. Subsequently, a back electrode 61 is deposition formed on the back side of the substrate 51.

With the above structure, it is possible to form a vacuum micro-element emitter by using the WSi side wall portion 56b formed by anisotropic dry etching.

In each of the above embodiments, the semiconductor material is not limited to GaAs, but it is possible to use Si or the like as well. Further, the gate electrode material is not limited to WSi, but it is possible to use other material such as $MoSi_x$, WN and TiN which can be sintered without deterioration of the Schottky character and which is capable of dry etching. Further, it is possible to dispense with the Au plating process by forming the ground Au layer to as large thickness as about 300 nm.

As has been described in the foregoing, according to the invention, it is possible to provide an FET which has a sufficiently reduced gate length and a reduced gate electrode resistance. Thus, with the gate length reduction, the noise characteristics and high frequency characteristics are improved, and further, with the gate electrode resistance reduction, the high frequency characteristics are improved.

Further, according to the invention, since the source resistance can be reduced, it is possible to increase the amplification degree of the FET.

Further, according to the invention, it is possible to form the electrode structures of the emitter, the base and the collector of the heterobipolar transistor other than the FET as well.

Further, according to the invention, it is possible to form a dual gate in the FET.

Further, according to the invention, it is possible to sufficiently reduce the gate length and reduce the gate electrode resistance. Further, it is possible to increase the accuracy of positioning of electrodes.

Further, according to the invention, it is possible to reduce the source resistance and increase the amplification degree of the FET.

What is claimed is:

1. A method of manufacturing a semiconductor device comprising the steps of:

forming a cover film on a surface of a semiconductor substrate such that the cover film exposes a portion of the surface, covers a remaining portion thereof and has an edge along a boundary between the exposed portion and the covered portion;

forming a first conductor film on the cover film formed in the cover film forming step, on the edge, and on the exposed surface portion of the semiconductor substrate;

removing the first conductor film formed in the first conductor film forming step other than a portion formed along the edge such that the first conductor film is left along the edge;

removing said cover film;

forming an insulating film on the opposite sides of the first conductor film left along the edge in the step of removing the first conductor film such that a top edge of said portion of the first conductor film along the edge is exposed; and forming a second conductor film on the surface of the insulating film formed in the insulating film forming step along the exposed top edge of the first conductor film.

2. The method of manufacturing a semiconductor device according to claim 1, comprising the additional step of etching the surface of the semiconductor substrate with the cover film used as a mask, between the cover film forming step and the first conductor film forming step.

3. The method of manufacturing a semiconductor device according to claim 2, wherein:

the semiconductor substrate has a surface layer in ohmic contact with a conductor and a deeper layer found underneath the surface layer and in Schottky contact with a conductor; and in the etching step, a recess is formed which penetrates the surface ohmic contact layer and which reaches the deeper Schottky contact layer.

4. The method of manufacturing a semiconductor device according to claim 2, comprising the additional step of etching the surface of said portion of the first conductor film and/or the surface of the semiconductor substrate, between the first conductor film removing step and the insulating film forming step.

5. The method of manufacturing a semiconductor substrate according to claim 2, comprising the additional step of covering a side wall of the recess and the edge of the cover film with a second cover film, between the semiconductor substrate etching step and the first conductor film forming step.

6. The method of manufacturing a semiconductor device according to claim 1, further comprising the steps of:

removing the insulating film with the second conductor film formed in the second conductor film forming step used as a mask; and forming a third conductor film on the surface of the semiconductor substrate exposed as a result of removal of the insulating film in the insulating film removing step.

7. The method of manufacturing a semiconductor device according to claim 1, wherein:

a cover film having a hole surrounded by a pair of edges is formed in the cover film forming step; and pair portions of the first conductor film extending along the pair edges of the hole are left in the first conductor film removing step.

8. The method of manufacturing a semiconductor device according to claim 7, wherein a second conductor film connected to both the remaining pair portions of the first conductor film is formed in the second conductor film forming step.

9. The method of manufacturing a semiconductor device according to claim 7, wherein a pair of second conductor films connected to the pair portions of the first conductor film, respectively, are formed in the second conductor film forming step.

10. The method of manufacturing a semiconductor device according to claim 1, wherein a plurality of layers are formed laminatedly on the surface of the semiconductor substrate, and wherein in the first conductor film removing step, the uppermost layer on the semiconductor substrate is removed to expose a deeper layer in a portion not covered by the cover film.

11. A method of manufacturing a semiconductor device comprising the steps of:

forming, on a surface of a semiconductor substrate with an emitter layer, a base layer and a collector layer laminated from a surface side, a cover film such that the cover film exposes a portion of the surface, covers a remaining portion thereof and has an edge along a boundary between the exposed portion and the covered remaining portion of the surface;

removing a part of the emitter layer with the cover film used as a mask;

forming a first conductor film on the surface and the edge of the cover film, the side surface of the remaining emitter layer and a surface of the base layer exposed with removal of the emitter layer;

removing the first conductor film formed in the first conductor film forming step except for a portion of formed along the edge of the cover film and the side surface of the emitter layer and also removing a part of the base layer to expose the collector layer;

removing said cover film:

forming an insulating film on the opposite sides of the first conductor film left in the step of removing the first conductor film such that a top edge of said portion of the first conductor film along the edge is exposed; and forming a second conductor film on the surface of the insulating film formed in the insulating film forming step along said top edge.

12. The method of manufacturing a semiconductor device according to claim 11, wherein:

the first conductor film is made of a zinc-doped metal; and a boundary between the first conductor film and the base layer is sintered after the second conductor film forming step.

13. The method of manufacturing a semiconductor device according to claim 11, wherein a zinc-doped metal is first formed, and then a metal film not doped with zinc is formed in the first conductor film forming step.

14. The method of manufacturing a semiconductor device according to claim 11, comprising the additional step of etching the surface of said portion of the first conductor film and/or the surface of the semiconductor substrate, between the first conductor film removing step and the insulating film forming step.

15. The method of manufacturing a semiconductor device according to claim 11, further comprising the steps of:

removing the insulating film with the second conductor film formed in the second conductor film forming step used as a mask; and forming a third conductor film on the surface of a semiconductor substrate exposed as a result of removal of the insulating film in the insulating film removing step.

* * * * *